United States Patent [19]

Gualtieri et al.

[11] Patent Number: 4,912,407
[45] Date of Patent: Mar. 27, 1990

[54] NON-CONTACTING INDUCTIVELY COUPLED DISPLACEMENT SENSOR SYSTEM FOR DETECTING LEVELS OF CONDUCTIVE, NON-MAGNETIC LIQUIDS, AND METHOD OF DETECTING LEVELS OF SUCH LIQUIDS

[75] Inventors: Devlin M. Gualtieri, Ledgewood; Edward Porbansky, Colonia; Mandayam C. Narasimhan, Flemington, all of N.J.

[73] Assignee: Allied-Signal Inc., Morris Township, Morris County, N.J.

[21] Appl. No.: 275,472

[22] Filed: Nov. 23, 1988

Related U.S. Application Data

[63] Continuation-in-part of Ser. No. 79,565, Jul. 30, 1987, abandoned.

[51] Int. Cl.⁴ .................... G01F 23/00; G01B 7/14; B22D 2/00
[52] U.S. Cl. ........................ 324/204; 73/290 R; 73/DIG. 5; 164/449; 324/236; 324/207.16; 336/208
[58] Field of Search ............. 324/61 QL, 61 QS, 204, 324/207, 236, 327; 73/290 R, DIG. 5, 304 R; 340/618; 336/208; 164/449

[56] References Cited

U.S. PATENT DOCUMENTS

| | | | |
|---|---|---|---|
| 2,442,805 | 6/1948 | Gilson | 324/236 X |
| 3,058,345 | 10/1962 | Mastras . | |
| 3,152,303 | 10/1964 | Lary et al. | 324/204 |
| 3,528,004 | 9/1970 | Katabami | 324/236 |
| 3,619,805 | 11/1971 | Bean | 331/65 |
| 3,808,524 | 4/1974 | Tarassoff et al. . | |
| 3,851,242 | 11/1974 | Ellis | 324/236 |
| 4,092,860 | 6/1978 | Arts et al. | 73/304 R |
| 4,165,641 | 8/1979 | Pomerantz et al. | 73/290 R |
| 4,175,612 | 11/1979 | Baumert | 164/449 |
| 4,418,570 | 12/1983 | Warren, Jr. et al. | 73/304 R |
| 4,647,854 | 3/1987 | Yamada et al. | 324/207 |

FOREIGN PATENT DOCUMENTS

| | | |
|---|---|---|
| 1485514A | 9/1977 | United Kingdom . |
| 2027210A | 2/1980 | United Kingdom . |
| 2165653A | 4/1986 | United Kingdom . |

OTHER PUBLICATIONS

IEEE Transactions on Magnetics, 22, No. 2, Mar. 1986, pp. 118-123, R. L. Maresca, "A General Method for Designing Low-Temperature Drift, High-Bandwidth, Variable-Reluctance . . . ".

Kaman Inst. Corp., 108, 1982, "General Application Considerations Inductive Displacement Measuring Systems", 2 pages.

*Primary Examiner*—Gerard R. Strecker
*Attorney, Agent, or Firm*—Gerhard H. Fuchs; Richard C. Stewart; Ernest D. Buff

[57] ABSTRACT

An inductance coil serves as a displacement sensor arranged in connection with a tuned circuit of an oscillator. Liquid level displacement in an LEC crystal growth environment is sensed as a frequency change in the oscillator circuit as compared to a set point value. The sensor is protected from the environment by an outer protective sheath of non-conductive, non-contaminating material such as boron nitride.

6 Claims, 7 Drawing Sheets

NON-CONTACTING INDUCTIVELY COUPLED DISPLACEMENT SENSOR SYSTEM FOR DETECTING LEVELS OF CONDUCTIVE, NON-MAGNETIC LIQUIDS, AND METHOD OF DETECTING LEVELS OF SUCH LIQUIDS

CROSS-REFERENCE TO RELATED APPLICATION

This application is a continuation-in-part of our co-pending U.S. Appl. Ser. No. 079,565 Filed July 30, 1987 now abandoned

BACKGROUND OF THE INVENTION

The invention relates to an inductive sensor for use in detecting the level of conductive, non-magnetic liquids, especially for use in a high pressure, high temperature environment, for example, of the type used in liquid-encapsulated Czochralski (LEC) growth of crystals such as gallium arsenide or indium phosphide.

Inductive sensors have been known for use in a number of inspection and monitoring applications. The basic principles of inductive techniques are well known. More specifically, an oscillating current flowing in a coil causes the field of one winding to add to the field of the next winding. The fields pulsate, in turn generating a pulsating electromagnetic field surrounding the coil. Placing the coil a nominal distance from a conductive or metal target induces a current flow on the surface and within the target. The induced current produces a secondary magnetic field that opposes and reduces the intensity of the original field, and changes in the impedance of the exciting coil can be analyzed to tell something about the target or the distance from the target.

Examples of such inductive sensor systems are, for example, disclosed in "A General Method for Designing Low-Temperature Drift, High-Bandwidth, Variable-Reluctance Position Sensors" by R. L. Maresca; IEEE Transactions on Magnetics, Vol. Mag-22, No. 2, March 1986 and a brochure published by Kaman Instrumentation Corporation in 1982, application note number 108 "General Application Considerations Inductive Displacement Measuring Systems". These sensors, while generally working satisfactorily in detecting surface conditions of non-magnetic metallic objects in atmospheric conditions and the like, are generally not thought suitable for use in an environment such as Czochralski growth of crystals.

More specifically, in liquid encapsulated Czochralski growth (hereinafter LEC) of crystals, the environments are generally thought to be extremely hostile to such sensor systems in a manner such that detrimental effects of the environment on the sensor itself preclude reliable inductive measurements in such environments. It is often the case that long exposure to high temperatures will cause sensor measurements to drift despite the fact that there was no change in liquid level. Thus, accuracy is compromised. Further, in the growth of gallium arsenide especially, it is often the case that arsenic becomes deposited on portions of the coil of the sensor thereby shorting out the coil and making further position measurements unreliable. Thus, in the growth of such crystals it has generally been the practice to employ physical contact melt depth sensors.

A problem with physical probes in the field of crystal growth is that they tend to disrupt the surface of the melt. Typically, it is essential in the field of such crystal growth that conditions be maintained very stable inasmuch as such growth involves contacting a seed crystal to the melt and thereafter very delicately pulling the growing larger crystal being grown and pulled by the seed from the melt. Any disruptions in the surface of the melt can result in separation of the pulling seed crystal from the melt thereby disrupting and terminating the process of crystal growth. Another problem with electrical contact probes is the contamination of the melt with unwanted impurities in the semi-conductors melt from the contacts.

In accordance with the invention, these problems encountered by physical contact of crystal melt are avoided by providing an inductive type sensor system which can be employed in such hostile environment crystal growth techniques.

SUMMARY OF THE INVENTION

In accordance with the invention there is provided a non-contacting displacement sensor for measuring levels of conductive, non-magnetic liquids in high temperature and high pressure crystal growth. The sensor comprises a non-conductive cylindrically shaped tube having a spiral groove on the outer surface extending along the length thereof at a predetermined pitch. To form the sending/receiving coil, a conductive wire is wound about the cylindrically shaped tube, in the groove, and has two ends extending from one end of the tube. In operation, this coil inductively couples to the conductive, non-magnetic liquid the level of which is to be sensed. A protective sheath surrounds the wire coil to prevent the conductive liquid from coming into contact with the wire when the sensor is in use. The sheath is positioned such that the two ends of the wire extend out from the one end of the tube. A power supply is connected to the wire for supplying power thereto, with resonance means in line with the wire to cause current flowing through the wire to oscillate, whereby upon change in proximity of the tube to a conductive liquid, the frequency of oscillation will change as a function of distance, because induced eddy currents within the conductive, non-magnetic liquid cause a change in inductance in the system. The magnitude of frequency change is a function of the change in distance between the tube and the conductive, non-magnetic liquid.

In a more specific aspect, the protective sheath is a boron nitride, silicon nitride, aluminum nitride or aluminum oxide tube, especially adapted for use in gallium arsenide crystal growth, closed at one end and open at the other end to permit the two ends of the wire to extend therefrom. Still further, preferably the tube having the wire wound around it is made of either boron nitride, silicon nitride, aluminum nitride or aluminum oxide.

The sensor system further comprises an insulator plug mountable in an opening leading to a high pressure and high temperature crystal growth chamber of the type from which such crystals can be grown from a conductive liquid, for sealing such an opening. The insulator plug has two openings with conductive inserts therein. At one end, the inserts have an opening for receiving the respective ends of the conductive wires. These openings extend into passageways leading into openings on the other end of the inserts. Conductive wires extend into the openings and passageways. The second openings on the other end in the plug inserts are of a size sufficient to receive "banana" plugs therein which serve to connect the wires to the power supply and to the detecting circuits for the sensor. Still yet further, the power supply is connected to the wires through the "banana" plugs. The power supply is of the type for supplying an oscillating current through the wires and having an output to supply a signal indicating the frequency of oscillations of said oscillating current to a detector. A counter is connected to the output to count the oscillations per time of the current in the wires whereby as a result of varying oscillations from a predetermined value, proximity of the sensor to a non-magnetic, conductive liquid in the chamber can be determined.

Stability of the power supply can be further enhanced by placing it in a thermostatic chamber, or using other commonly employed temperature-stabilizing techniques.

As previously stated, in operation the coil couples inductively to the conductive, non-magnetic liquid, thereby generating eddy currents at or near the surface of the liquid. These induced eddy currents cause a change in the inductance of the system comprising the sending/receiving coil (sensor) and the liquid. In essence, an electromagnetic detection system is employed to sense the level of a non-magnetic liquid. To obtain sufficient sensitivity of the system permitting discrimination between distances in the order of a few mm, it is essential that (1) the gap between the sensor and the top surface of the liquid is kept as small as is practically possible, viz between from about 5 to about 40 mil (from about 0.125 to about 1 mm); and (2) the frequency of oscillation of the current in the sensor is within the range of from about 1 MHz to about 100 MHz. At frequencies below about 1 MHz, the sensitivity becomes too low for practical purposes, and at frequencies above about 100 MHZ the noise level becomes too high. Utilization of these high frequencies (frequencies above 1 MHz) is essential to successful operation of our level sensing system. Use of these high frequencies is in stark contrast to the substantially lower frequencies, in the order of up to a few KHz, which are employed in conventional systems which coupled inductively to magnetic and non-magnetic but conductive reference elements, but with less efficiency and sensing effect.

Therefore, in another aspect of the invention there is provided a method for sensing changes in distance between the top surface of an electrically conductive, non-magnetic liquid and a level sensor comprising a sending/receiving coil which comprises in combination, (a) placing said level sensor in close proximity to the liquid above the top surface thereof such that the gap between the sensor and the surface is within the range of from about 0.0125 to about 1 mm; (b) generating an oscillating current of frequency sending/receiving coil to thereby inductively couple the sensing-/receiving coil to the liquid and (c) sensing the change in frequency in the oscillating current resulting from changes in the gap between the sensor and the liquid surface, to thereby determine changes in the relative distance between the sensor and the liquid level.

In a more specific aspect, the electrically conductive, non-magnetic liquid is molten gallium arsenide, and the sensor is constructed as described, supra. The molten gallium arsenide is contained under pressure at elevated temperature in a sealed chamber. In addition, the method further comprises detecting the temperature in the sealed chamber and applying a correction factor to the power supply upon a change in temperature in the chamber to compensate for temperature effects in the chamber.

The measured melt position is used to maintain the melt level in the GaAs furnace using a proportional integrating and derivative (PID) control loop. The output of the PID control loop is used to drive a motor which displaces the crucible in the furnace. The velocity of the motion of the crucible is indicative of the area of the crystal grown, since the melt level in the furnace is preserved throughout the growth period. This measured area of the crystal is compared with the desired area of the crystal and a PID loop based on these parameters is used to modify the heating power to the crystal growth furnace. Alternatively, the crucible could be displaced according to the desired shape of the crystal and the melt level change is reflective of the difference between the actual crystal growth and desired crystal shape. A PID control loop using these process parameters modifies the power supplied to the crystal growth furnace. In either case, the melt level information is used to provide actual area of the crystal grown and this information is used to modulate the power, providing automatic crystal growth control.

BRIEF DESCRIPTION OF THE DRAWINGS

Having briefly described the invention, the same will become better understood from the following detailed discussion thereof, taken in conjunction with the drawings wherein.

DETAILED DISCUSSION OF THE INVENTION

Figure 1:
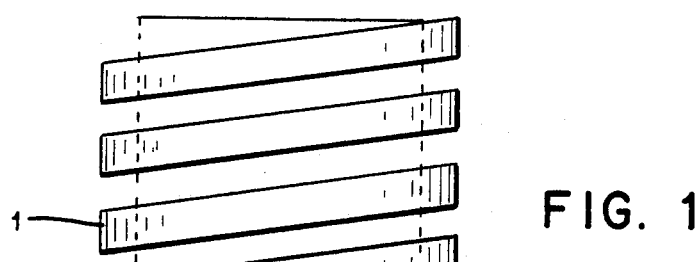
FIG. 1 is a schematic diagram of the positioning of a sensor in accordance with the invention relative, for example, to a gallium arsenide melt in a Czochralski growth chamber.

The sensor in accordance with the invention is partially shown in FIG. 1 as a wound coil of conductive wire 1, preferably of molybdenum, which is, when employed in sensing, positioned at a separation D from a conductive liquid melt 3 such as gallium arsenide. The principle of operation of the sensor is by inductance changes which result in a variation of an oscillating current therein which can be detected and which is a function of the separation D from the surface of the conductive liquid melt 3.

Figure 2:
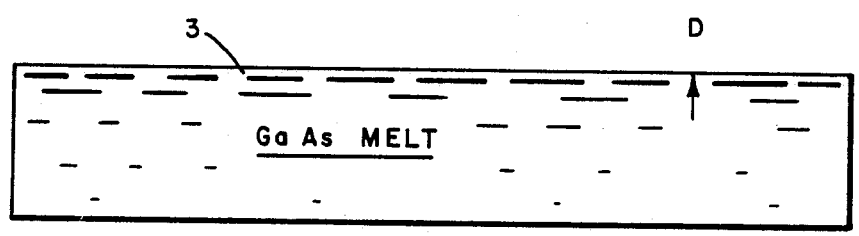
FIG. 2 is a side schematic view of the base tube of the sensor in accordance with the invention.
Figure 2:
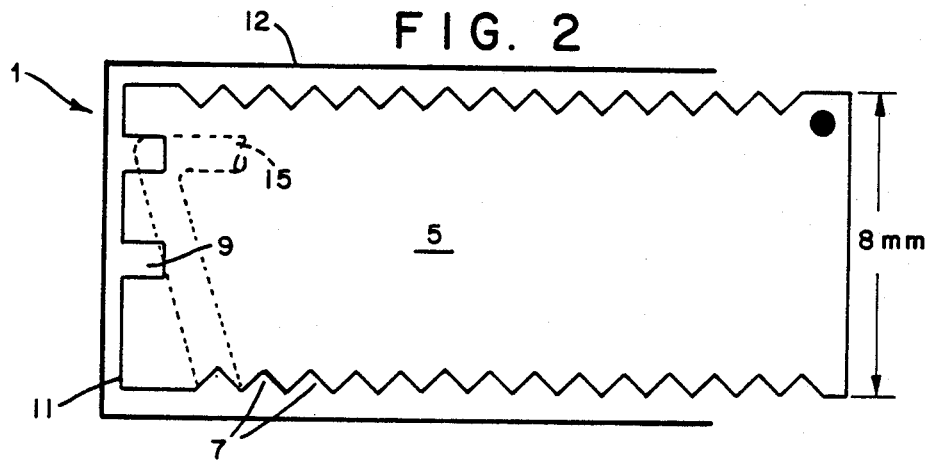
Figure 4:
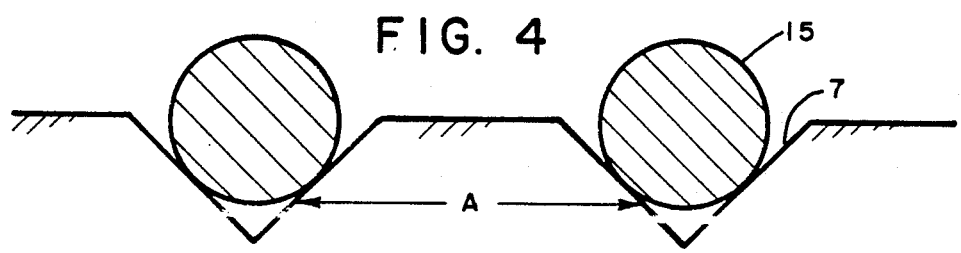
FIG. 4 is an exploded partial side view showing details about the helical groove, having a conductive wire wound therearound, of the sensor of the invention.
Figure 3:
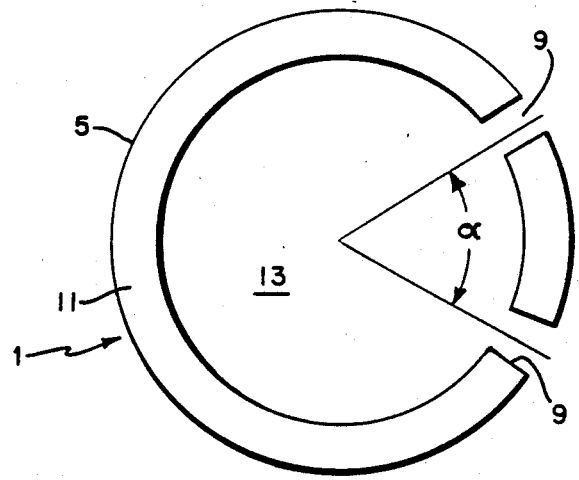
FIG. 3 is a bottom plan view schematically illustrating the bottom of the tube of the sensor of the invention.

In FIG. 2 there is shown a more detailed side view of a support tube 5 making up the sensor element 1. The support tube 5 includes a single helical groove 7 extending therearound to result in up to 17 levels at which a wire can be wound around the groove. Two notches 9 are located at the bottom 11 of the tube 5 to permit loop back of a wire 15 which is wound around the tube 5. As shown in FIG. 3, preferably the notches 9 are spaced at an angle $\alpha$ from each other, which angle is equal to about 45°. The tube 5 as can be seen is hollow and has an inner space 13. As shown in FIG. 4, the wire is preferably molybdenum wire of about 24 A.W.G. Of course as will be readily apparent to those of ordinary skill in the art other equivalents can be substituted.

With respect to the helical groove, it can be appreciated from FIG. 4 that a precise spacing A between respective turns of the groove is maintained to ensure uniformity of current flow and inductance effects on the wire. With respect to the tube material 5 it is preferably boron nitride although a material such as silicon nitride, aluminum nitride or aluminum oxide can be substituted. When assembled, an outer sheath 12 as shown in FIG. 2 can be assembled on the tube to isolate and protect the coils of wire from, for example, vapor deposition of arsenic which could short out the coils. Preferably the outer sheath 12 is also made of boron nitride, and as can be seen from FIG. 2 fully encloses the bottom 11 of the inner tube 5.

Figure 5:
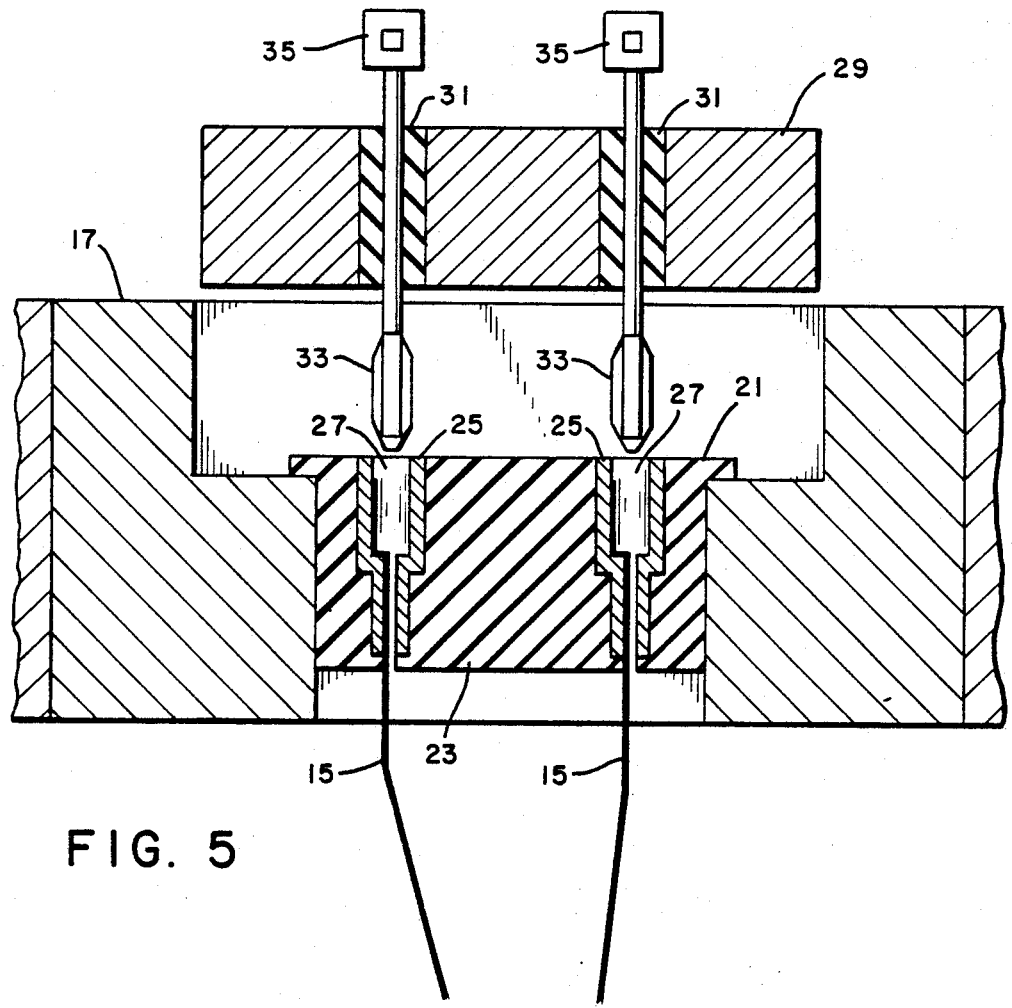
FIG. 5 is a partial side cross-sectional view illustrating the connecting arrangement for the sensor of the invention, received within the Czochralski growth chamber, and showing the interconnection to exterior circuitry.

In FIG. 5 there is shown the connection arrangement to a power supply and detection circuit employed with the tube. More specifically, a reference numeral 17 refers to the wall of the pressure vessel which contains the conductive melt as well as other equipment associated with the crystal growing process. Wall 17 includes an opening for providing the electrical connections to the level sensor within the vessel. To that end, the opening receives an insert 21 which is composed of a boron nitride body 23. In boron nitride body 23 is provided a pair of stainless steel connectors 25, which provide a passageway for passing wires 15, which are connected to the level sensor. Stainless steel connectors 25 have a smaller opening towards the interior of the pressure vessel and a larger opening, sufficient to receive banana plugs 33, towards the exterior. Wires 15 terminate within the larger opening of stainless steel connectors 25 to permit electrical contact with the banana plugs 33. Banana plugs 33 extend through closure 29. Closure 29 in FIG. 5 is shown in the open position. In operation, it will be inserted in the opening provided in wall 17 to make electrical connection between wires 15 and the banana plugs, and to retain insert 21. To that end, closure 29 will be clamped (by means not shown) against wall 17 of the pressure vessel within the opening provided therefor. Banana plugs 33 are passed through insulating inserts 31 provided in closure 29. Exterior contacts 35 on banana plugs 33 are provided for making contact with associated circuitry. In this arrangement, due to the small size of the opening through which the wires 15 are received, there is the no possibility of arsenic diffusing as vapor up into the connecting arrangement and fouling up or shorting the contacts of the banana plugs 33 within stainless steel connector 25. More specifically, effective electrical isolations of the contacts from each other and the, e.g., arsenic is maintained, as is tautness of wires. Tautness of wires 15 is required, since moving wires will give spurious signals. By tautness is meant sufficiently tight such that the wires do not move without application of a predetermined minimum external force.

Figure 6:
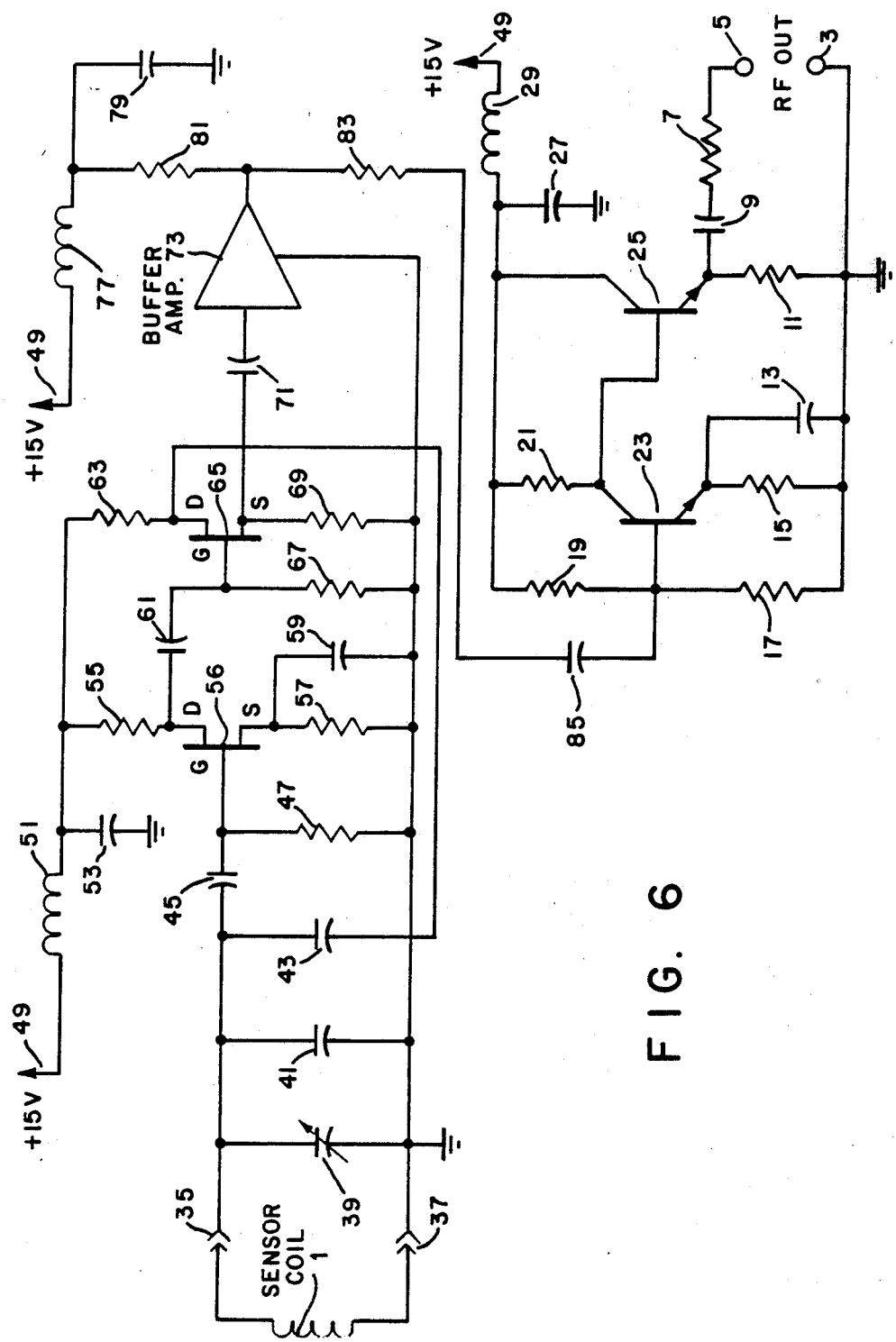
FIG. 6 is a schematic diagram illustrating the power supply and oscillation detecting circuit of the sensor of the invention.

As shown in FIG. 6, sensor coil 1 is connected through contacts 35 and 37 to a two-stage oscillating circuit. Field-effect transistors 56 and 65 are connected through resistive and capacitive components 45, 47, 55, 57, 59, 61, 63, 67, and 69 as an amplifier. This amplifier circuitry is powered by a 15 volt current supply 49, as filtered through the inductance/capacitance filter elements 51 and 53. The resonant condition of the oscillator is set by the inductance of the sensor coil 1 and the parallel capacitors 39 and 41. The amplifier is arranged to oscillate at the resonance frequency by a feedback capacitance 43, and the output is buffered by a buffer amplifier comprised of amplifier circuit 73 and resistor 81, and powered by the 15 volt current supply 49 through the inductance/capacitance filter elements 77 and 79. The buffered frequency output is then applied through resistor 83 and capacitor 85 to line-driver circuitry suitable for sending radio frequency signals of the resonant frequency through a 50 ohm coaxial cable. This line driver is comprised of the buffer amplifier stage formed by transistor 23 and its associated resistors and capacitors 13, 15, 17, 19, and 21, and the emitter-follower stage formed by transistor 25 and resistor 11. The line driver circuitry is powered by a 15 volt current supply 49, as filtered through the inductance and capacitance combination 27 and 29. The resonant frequency signal can then be supplied to a 50 ohm coaxial cable at terminals 3 (shield) and 5 (inner conductor) which complete the connection to the line driver through resistor 7 and capacitor 9. The purpose of the 50 ohm line driver is to allow simple connection to standard laboratory instruments for measurement of the resonant frequency and computation based on such a measurement. Such instruments are used to detect changes in the resonant frequency which result from movement of the liquid melt relative to the sensor coil, and thus, as a function of the change, the distance of the sensor coil from the conductive melt. The choices of frequency determining elements 1, 39, and 41 are such that the nominal oscillating frequency is 10,000,000 Hz (10 MHz).

Stability of this circuitry is enhanced by placement in a thermostatic oven. The temperature of this oven is set at about 35 degrees Centigrage, which is far enough above the ambient room temperature to allow a constant circuit temperature regardless of room temperature variations. The oven is constructed from a cylinder of poly-vinyl chloride 48 mm outside diameter, 100 mm length and 4 mm wall thickness. This cylinder is wrapped with an evenly spaced bifilar winding of 160 turns of 36 A.W.G. copper wire, 80 feet in length, of approximately 35 ohms resistance. The bifilar winding serves to reduce the net inductance. The twelve volt current supply to this heater is provided by temperature regulating circuitry, described below, and provides about 4 watts of power. A temperature sensor, described below, is fixed to the outside of this cylinder at an equal distance from the ends with poly-vinyl chloride tape to ensure good thermal contact. The outside of the cylinder is then wrapped in two layers of 0.002 inch aluminum foil, 5 mm thick plastic foam insulation, and poly-vinyl chloride tape. After placement of the resonating circuit, the ends of the cylinder are capped by 10 mm thick plastic foam insulation. The necessary connecting wires to the sensor coil, current supply, and the coaxial output are routed through holes in the foam insulation of the end caps.

Figure 7:
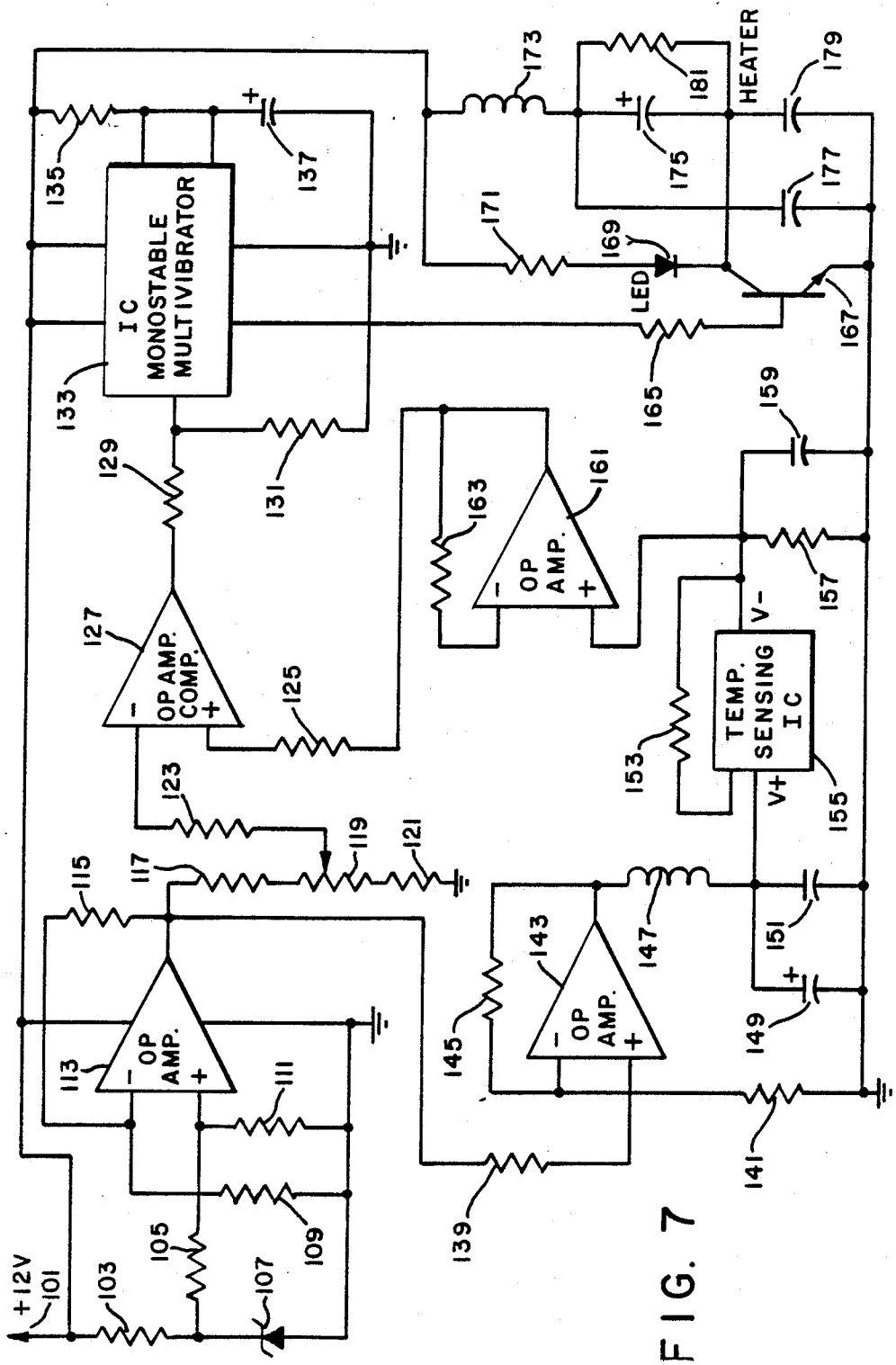
FIG. 7 is a schematic view of a temperature compensating circuit employed with the sensor of the invention.

FIG. 7 shows the circuit for control of the oven temperature. Operational amplifier 113, which is a portion of an LM324N integrated circuit, forms a precision voltage reference source with a band gap reference integrated circuit 107. A 12 volt current supply 101 provides a biasing current to the band gap reference integrated circuit 107 through resistor 103. The temperature stable reference voltage from the band gap reference integrated circuit is applied to a non-inverting amplifier comprised of operational amplifier 113 and its associated resistors 109, 111, and 115. The amplified reference voltage is then buffered by operational amplifier 143 and its associated resistors 139, 141, and 145, and it is then applied through a filter comprised of inductor 147 and capacitors 149 and 151 to power the temperature sensing integrated circuit 155. This temperature sensor is mounted on the thermostatic oven is close thermal contact with the heating element 181, as described above, to provide necessary feedback for temperature control purposes. This temperature sensor is biased by resistor 153 to provide a temperature signal of approximately 10 mV/°C. at about 3 volts at room temperature across resistor 157. The voltage signal across resistor 157 is filtered by capacitor 159 and buffered by operational amplifier 161 and its associated resistor 163. The buffered temperature signal is then compared by operational amplifier 127 and its associated resistors 123 and 125 with a set-point voltage provided by the voltage divider comprised of resistors 117, 119, and 121. During operation of the oven, this set-point voltage is adjusted to obtain the desired oven temperature of 35° C. The output of the operational amplifier comparator 127 is a square-wave signal which cycles between low and high voltages of about 2 and 10 volts with respect to circuit ground. This high/low output state is a heat demand signal which indicates whether the oven temperature is above or below the set-point temperature. This temperature demand signal is applied through the voltage divider comprised of resistors 129 and 131 to the trigger input of the monostable multivibrator integrated circuit 133, the cycle time of which is set by resistor 135 and capacitor 137. A temperature demand signal indicating a need for more heat wil cause the output of integrated circuit 133 to be at 12 volts with respect to circuit ground for at least as long as the timing elements 135 and 137 allow, which is about 1–2 seconds for the component values shown. A constant demand for more heat, as when the circuit is first activated at room temperature, will casue the output of integrated circuit 133 to remain at 12 volts continuously, allowing maximum heating effect. At oven temperatures near the set-point, infrequent output pulses of about 1–2 seconds duration will appear as the oven temperature drifts just above and below the set-point.

The output of the monostable multivibrator integrated circuit 133 is applied through resistor 165 to transistor 167 which switches current from the 12 volt current supply 101 through the oven heater resistance coil 181. Light emitting diode 169, powered through resistor 171, is wired to show the on/off status of the oven heater. The inductance and capacitance elements 173, 175, 177, and 179 filter the current pulses applied to the oven heater resistance coil.

The component oven, as controlled by the circuitry in FIG. 7, provides 0.1° C. temperature stability for the resonator circuitry of FIG. 6, allowing accuracy of distance measurement. Those skilled in the art will discern other methods of temperature compensation, such as replacement of resistive elements with elements of specific temperature coefficient of resistance, or sensing the temperature of the circuit and deriving a correcting biasing voltage for transistors 56 and 65 of FIG. 6. Circuitry of FIG. 6 can be integrated onto a single substrate with integral substrate heater and temperature controller. These are given as examples and are not intended to limit the scope of possible temperature compensation measures.

Figure 8:
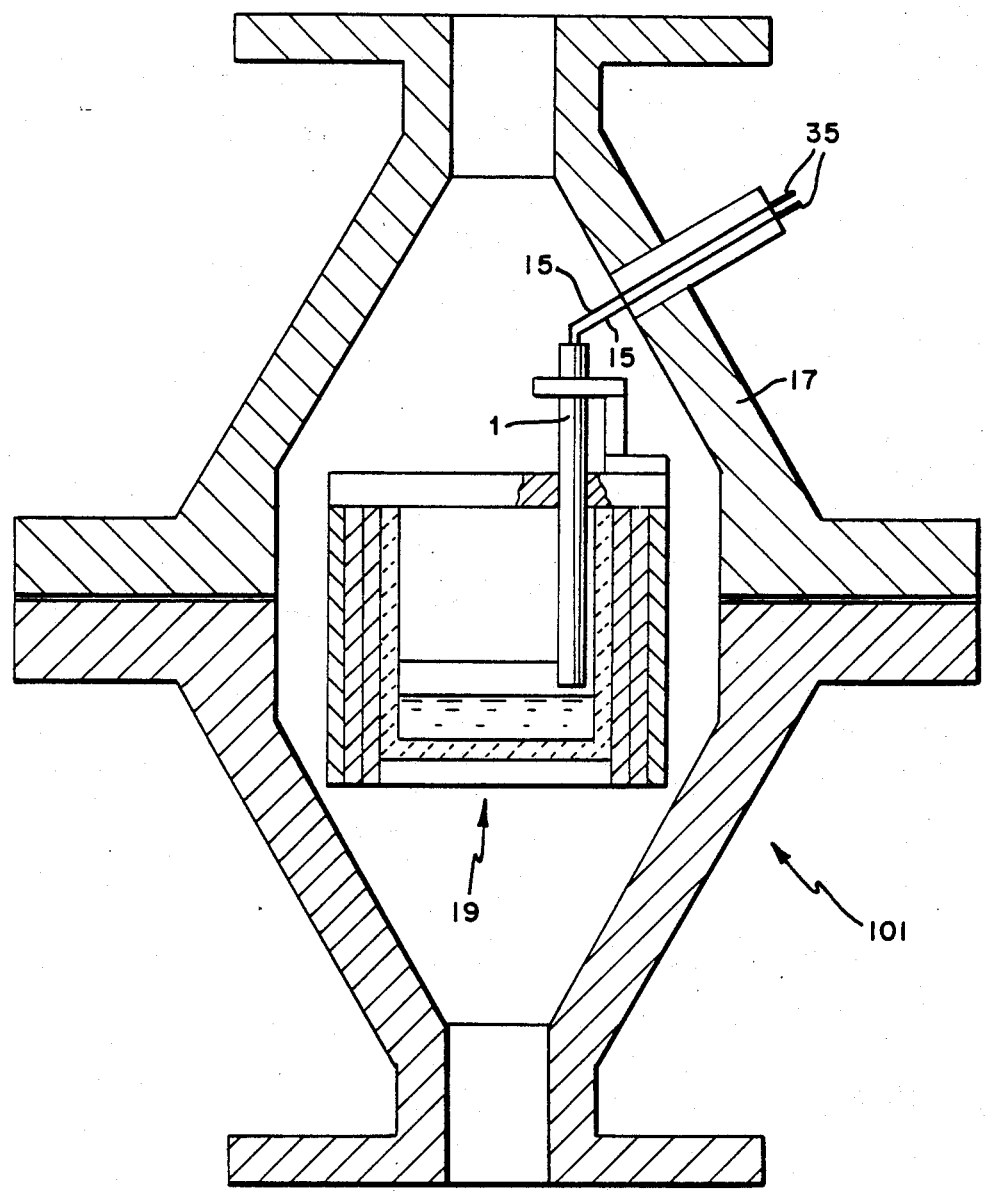
FIG. 8 is a partial side cross-sectional schematic view showing the crystal growth chamber with which the sensor of the invention is employed illustrating how the sensor is mounted therein and the connecting leads to outside located electronic control circuitry.

FIG. 8 is shown a typical pressure vessel for use in crystal growth utilizing a level sensor of the present invention. Pressure vessel 101 encloses melt vessel 19 with associated sensor 1. Wires 15 from sensor 1 are passed through wall 17 of pressure vessel 101 by means of the arrangement illustrated in detail in FIG. 5. External connecting terminals 35 are provided for connecting the sensor to external circuitry (not shown).

Figure 9:
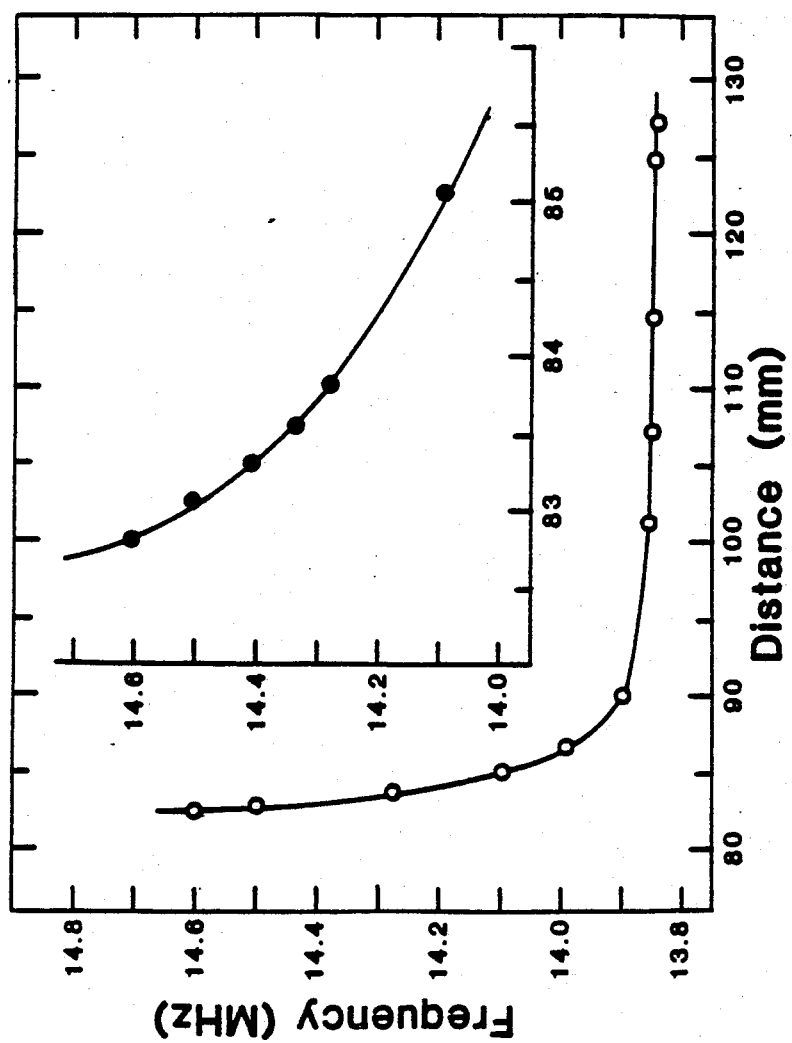
FIG. 9 shows the sensor response at room temperature and atmospheric pressure using a copper sensing coil responding to a change in distance from a conducting and non-magnetic copper sheet.
Figure 10:
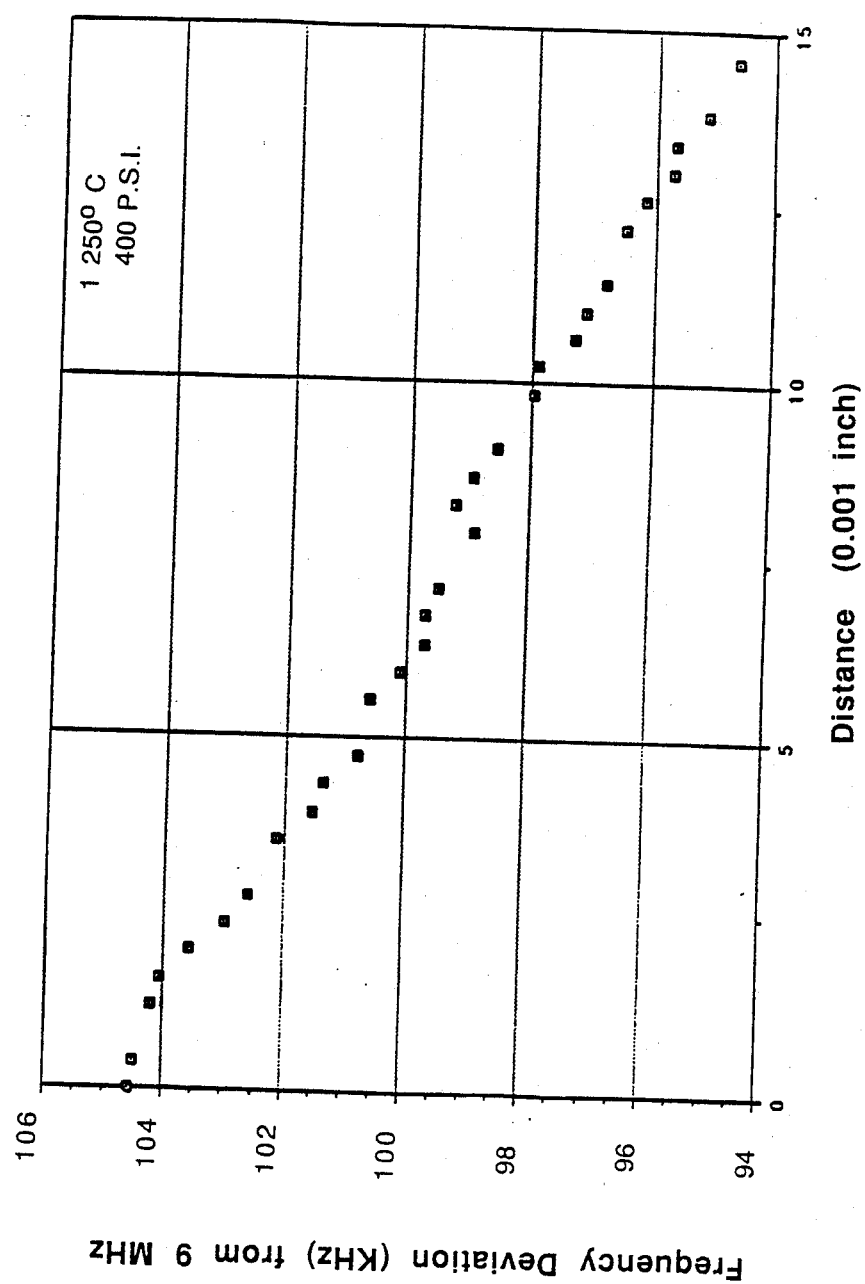
FIG. 10 shows the sensor response under a high temperature (1250° C.), high pressure (400 P.S.I.) state with a sensor coil formed from molybdenum wire responding to a change in distance from a conducting and non-magnetic liquid of molten gallium arsenide.

FIG. 9 shows the sensor response at room temperature and atmospheric pressure using a copper sensing coil responding to a change in distance from a conducting and non-magnetic copper sheet; FIG. 10 shows the sensor response under a high temperature (1250° C.), high pressure (400 P.S.I.) state with a sensor coil formed from molybdenum wire responding to a change in distance from a conducting and non-magnetic liquid of molten gallium arsenide.

The following descriptions of these figures, and further comments explain the factors which affect sensitivity of the sensor system and more precisely defines the construction of the sensor coil by stating an upper limit on the number of turns of the coil and a lower limit on the inductance of the coil.

FIG. 9 shows the frequency output of an oscillator circuit which uses a displacement sensor coil as part of an inductance/capacitance frequency-determining parallel "tank" network. The coil was formed from 17 turns of 28 A.W.G. copper wire wound on a 10 mm diameter form to a length of 13 mm. The frequency readings are shown as a function of distance of a copper sheet from the coil which is at the position 82.4 mm. These measurements were performed when the sensor coil and copper sheet were at room temperature and atmospheric pressure. The frequency at closest approach to the coil is about 14.6 MHz, and the frequency at a large separation between the coil and sheet is about 13.9 MHz. The fractional frequency change between the sheet at large separation and closest approach is about (0.7/13.9), which is approximately (1/20). This is very close to the predicted value of (1/17), as explained further below. FIG. 9 illustrates the frequency dependence of the sensitivity of gap measurement.

FIG. 10 shows the deviation from a reference frequency of the frequency output of an oscillator circuit which uses a displacement sensor coil as part of an inductance/capacitance frequency-determining parallel "tank" network. The coil was formed as the coil in FIG.

9, but the wire was molybdenum of nearly the same diameter. The frequency deviation is shown as a function of relative distance between the coil and a molten liquid metal (gallium arsenide). The coil and molten metal were at 1250° C. and 400 P.S.I. pressure. This figure demonstrates the utility of the invention at high temperature and pressure.

The following comments concern the factors affecting sensitivity of displacement the sensor in our invention.

A conducting and non-magnetic surface placed near an inductance coil being excited by an oscillating electric current will dissipate some of the currents in the coil by short-circuiting part of the electric field surrounding the coil. When the conductive and non-magnetic surface is placed as close to a coil as the spacing of its turns, it will behave as a shorted turn of the coil which will dissipate the oscillating currents present in one existing turn of the coil. In effect, the number of turns of the coil, N, is reduced by one to (N-1).

The inductance L of a solenoid coil is a function of the square of its turns number, and its enclosed volume V, $$L = \mu_o N^2 V$$

where $\mu_o$ is the permeability of air, which is about $4\pi \times 10^{-7}$ weber/(amp-meter). The resonant frequency f of an inductance/capacitance tuned circuit is $$f = (1/(2\pi))(LC)^{-\frac{1}{2}}$$

where C is the capacitance. The frequency is given in hertz when the capacitance is in farads and the inductance is in henrys. We can define a sensitivity function S which expresses the fractional change in frequency obtained with a change in the turns number of the coil $$S = |(1/f)(df/dN)|$$

where (df/dN) is the derivative change of frequency with turn number, and the bars | | specify the absolute value function. It is seen that $$S = (1/N)$$

and a small number of turns for the sensor coil would give the greater sensitivity.

For practical purposes, a sensitivity of greater than about 1% is desired, so that N should be less than about 100; that is, the number of turns of the sensor coil should be less than about 100.

It would appear from the preceding analysis that a single turn coil would offer the highest sensitivity and the greatest practical advantage. This, however is not the case, since such a small coil would have a very small inductance, and the resonant inductance-capacitance circuit would have too low a quality, or "Q"-factor, for stable function in an oscillator circuit.

The quality, or "Q", of a parallel inductance/capacitance resonant circuit is given as $$Q = (1/R)(L/C)^{\frac{1}{2}}$$

where R is the equivalent dissipative resistance of the circuit, usually the resistance of the wire of the inductance coil. Stable oscillator circuits which use an inductance/capacitance resonant circuit as the frequency-determining element exhibit most stable operation at high Q. The usual requirement is for Q to be greater than 10. Since stray capacitance in the sensor leads and connector assembly are of the order $10^{-12}$ farad, and the coil resistance is generally about 1 ohm, this sets a limit on the coil inductance such that L must be greater than about 0.01 microhenry.

In the most preferred embodiment, the sensor coil has about seventeen turns, and an inductance of 0.5 microhenry. The Q of the inductance/capacitance resonant circuit is about 50, and the resonant frequency is of the order of $10^7$ Hz. Operating frequency range is from about 1 to about 100 MHz, with operation between about 5 and about 100 MHz being preferred, and between about 15 and about 100 MHz being most preferred.

Having described the invention in detail, the scope thereof is set forth in the appended claims.

We claim:

1. The method of sensing changes in the level of molten, electrically conductive, non-magnetic liquid selected from the group consisting of gallium arsenide and indium phosphide which is contained in a sealed chamber under pressure which comprises, in combination,
    (a) generating an oscillating current of frequency within the range of from about 1 MHz to about 100 MHz;
    (b) passing said current through a sending/receiving coil located at a distance of from about 0.125 to about 1 mm from the top surface of said liquid, to inductively couple said coil to said liquid; and
    (c) sensing changes in the frequency in said oscillating current caused by changes in the gap between the top surface of said liquid and said coil;
    whereby changes in the gap, which are caused by changes in the top level of said liquid, are indicated by changes in the frequency of said oscillating current.

2. The method of claim 1, wherein the liquid is molten gallium arsenide.

3. The method of claim 2, wherein the frequency of said oscillating current is within the range of from about 5 MHz to about 100 MHz.

4. The method of claim 1 wherein the sensor is comprised of a non-conductive cylindrically shaped tube having a spiral groove on the outer surface extending the length thereof, a conductive wire wound from about 2 to about 100 turns about said cylindrically shaped tube, in said groove and having two ends extending from one end of said tube, encased within a protective sheath means, for preventing the conductive liquid from coming in contact with said wire when said sensor is in use.

5. The method of claim 1 wherein the liquid is molten indium phosphide.

6. The method of claim 5, wherein the frequency of said oscillating current is within the range of from about 5 MHz to about 100 MHz.

* * * * *